(12) United States Patent
Fackenthal et al.

(10) Patent No.: US 9,837,151 B2
(45) Date of Patent: *Dec. 5, 2017

(54) MEMORY SYSTEMS AND MEMORY PROGRAMMING METHODS

(71) Applicant: Micron Technology, Inc., Boise, ID (US)

(72) Inventors: Richard E. Fackenthal, Carmichael, CA (US); Simone Lombardo, Milan (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/150,168

(22) Filed: May 9, 2016

(65) Prior Publication Data

US 2016/0254051 A1     Sep. 1, 2016

Related U.S. Application Data

(63) Continuation of application No. 14/107,764, filed on Dec. 16, 2013, now Pat. No. 9,336,875.

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/0011* (2013.01); *G11C 13/0061* (2013.01); *G11C 2013/0078* (2013.01); *G11C 2013/0092* (2013.01)

(58) Field of Classification Search
CPC ................................. G11C 13/0002

USPC ......................................................... 365/148
See application file for complete search history.

(56) References Cited

U.S. PATENT DOCUMENTS

| | | | |
|---|---|---|---|
| 6,879,525 B2 | 4/2005 | Van Brocklin et al. |
| 7,016,219 B1 | 3/2006 | Davies, Jr. |
| 7,219,271 B2 | 5/2007 | Kleveland et al. |
| 7,274,597 B2 | 9/2007 | Srowik et al. |
| 7,952,914 B2 | 5/2011 | Baek et al. |
| 7,974,117 B2 | 7/2011 | Tian |
| 8,050,077 B2 | 11/2011 | Li |
| 8,130,549 B2 | 3/2012 | Norman et al. |
| 8,154,904 B2 | 4/2012 | Sekar |
| 8,174,875 B2 | 5/2012 | Baek et al. |
| 8,264,887 B2 | 9/2012 | Yun et al. |
| 8,289,749 B2 | 10/2012 | Chen |
| 8,472,256 B2 | 6/2013 | Ruby |
| 8,565,004 B2 | 10/2013 | Iijima |
| 8,699,258 B2 | 4/2014 | Chien |

(Continued)

*Primary Examiner* — Hoai V Ho
(74) *Attorney, Agent, or Firm* — Wells St. John P.S.

(57) ABSTRACT

Memory systems and memory programming methods are described. In one arrangement, a memory system includes a memory cell configured to have a plurality of different memory states, an access circuit coupled with the memory cell and configured to provide a first signal to a memory element of the memory cell to program the memory cell from a first memory state to a second memory state, and a current source coupled with the memory cell and configured to generate a second signal which is provided to the memory element of the memory cell after the first signal to complete programming of the memory cell from the first memory state to the second memory state.

43 Claims, 8 Drawing Sheets

(56) References Cited

U.S. PATENT DOCUMENTS

| | | |
|---|---|---|
| 8,787,090 B2 | 7/2014 | Goda |
| 8,817,521 B2 | 8/2014 | Chen et al. |
| 8,848,421 B2 | 9/2014 | Kawai |
| 8,861,259 B2 | 10/2014 | Haukness |
| 8,923,056 B2 | 12/2014 | Kim |
| 8,934,292 B2 | 1/2015 | Costa |
| 8,971,088 B1 | 3/2015 | Jo |
| 9,123,414 B2 | 9/2015 | Kitagawa et al. |
| 9,171,612 B2 | 10/2015 | Taguchi |
| 9,336,875 B2 * | 5/2016 | Fackenthal ........ G11C 13/0069 |
| 2004/0255090 A1 | 12/2004 | Guterman et al. |
| 2008/0080238 A1 | 4/2008 | Yuda |
| 2008/0239806 A1 | 10/2008 | Moschiano et al. |
| 2009/0027961 A1 | 1/2009 | Park et al. |
| 2009/0190408 A1 | 7/2009 | Kux |
| 2009/0207657 A1 | 8/2009 | Tamada |
| 2010/0149880 A1 | 6/2010 | Chen et al. |
| 2011/0283081 A1 | 11/2011 | Barkley et al. |
| 2012/0230085 A1 | 9/2012 | Kawai et al. |
| 2013/0077398 A1 | 3/2013 | Kamano et al. |
| 2013/0148409 A1 | 6/2013 | Chung |
| 2013/0188426 A1 | 7/2013 | Park et al. |
| 2013/0250654 A1 | 9/2013 | Sugimae et al. |
| 2014/0112054 A1 | 4/2014 | Shimakawa et al. |
| 2014/0254238 A1 | 9/2014 | Gilbert et al. |
| 2014/0268992 A1 | 9/2014 | Otsuka et al. |
| 2015/0146472 A1 | 5/2015 | Kitagawa et al. |
| 2015/0170740 A1 | 6/2015 | Fackenthal et al. |
| 2015/0371706 A1 | 12/2015 | Kitagawa et al. |

* cited by examiner

MEMORY SYSTEMS AND MEMORY PROGRAMMING METHODS

RELATED PATENT DATA

This application is a continuation of and claims priority to U.S. patent application Ser. No. 14/107,764, which was filed Dec. 16, 2013, the teachings of which are incorporated herein by reference.

TECHNICAL FIELD

Embodiments disclosed herein pertain to memory systems and memory programming methods.

BACKGROUND

Memory devices are widely used in electronic devices, such as digital cameras and personal audio players, for storing digital data. Many different types of memory are available, each using a different fundamental technology for storing data, and the memory may be volatile or non-volatile memory. Resistive random-access memory (RRAM) including conductive-bridge random-access memory (CBRAM) and flash are examples of non-volatile memory.

In RRAM, a resistive memory cell switches from a high resistance reset state to a low resistance set state during a set pulse, in order to program a cell from a logic "0" to a logic "1". This programming is achieved with an electric field inducing ionic migration from an ion reservoir layer to an insulating layer, causing a conductive filament or "bridge" to form. Once a filament forms, current may flow in the memory cell. Some minimum current (i.e., Iset_final) is sustained for a minimum time for the memory cell to become "well" set.

Iset_final is controlled since the memory cell may not be well set if insufficient current is utilized and which may result in the memory cell being unable to retain the programmed set state. However, use of too much current may result in the memory cell being overset where it may be too difficult or impossible to recover the memory cell to the reset condition. Accordingly, it is desired to provide Iset_final of a set programming operation within a window between Iset_min_final (lower current level for data retention) and Iset_max_final (upper limit to avoid overset).

Referring to FIG. 1A, two separate conventional approaches to controlling Iset_final of a resistive memory cell 1 are discussed. The first approach controls the gate of a selector or access transistor 2 associated with the memory cell 1 to be programmed to a set state and current source 8 is not present or not utilized. The gate of the transistor 2 may be regulated so that the transistor 2 acts as a ballast since the transistor 2 is positioned relatively close to the cell 1. The memory cell 1 is additionally coupled with a bit line 4 which has an associated bit line capacitance 5 and resistance 6.

However, referring to FIG. 1B, the transistor 2 is relatively small and variations of the current may be significant resulting in an Iset_final current which is not within the desired window for programming discussed above. More specifically, the current may exceed the maximum/upper limit where the memory cell 1 is overset and may not be capable of being returned to the high resistive state, or the current may be less than the minimum/lower limit where the memory cell is under set and not programmed to the low resistive state.

The current source 8 is used to implement the second conventional approach for programming the memory cell 1 to a set state. The current source 8 is a current mirror located on a global bit line at the program load circuits outside of the memory array and is used to provide a set program pulse to memory cell 1 to form the filament. Transistor 2 is overdriven and Iset_final is regulated by current source 8. The current source 8 may be implemented using relatively large devices which may be controlled to provide tighter DC current distribution compared with the use of transistor 2 discussed above.

However, referring to FIG. 10, since the current source 8 is outside of the memory array, the current source 8 cannot prevent a transient current spike 9 resulting from the bit line capacitance 5 when the filament is formed. This current spike 9 is uncontrolled and may exceed Iset_max_final and overset the memory cell 1 or damage it.

At least some embodiments described below are directed towards memory systems and memory programming methods which provide programming of memory cells between different memory states and which may also be subsequently reprogrammed.

DETAILED DESCRIPTION OF EXAMPLE EMBODIMENTS

Some embodiments are directed towards memory systems and memory programming methods which use a plurality of signals to program a memory cell from one memory state to another different memory state. As discussed in example embodiments below, the memory cell may be a resistive memory cell which has different electrical resistances corresponding to different memory states of the memory cell and the example embodiments described below are utilized to change the programming of the memory cell from a first state having a high electrical resistance to a second state having a low electrical resistance. In one embodiment, an initial signal is applied to the memory cell to initially form an electrically conductive structure to initially program the memory cell from the first state in the second state. Thereafter, a second different signal is used during subsequent programming of the memory cell and is applied to the memory cell to provide the electrically conductive structure in a "well-set" state to complete the programming of the memory cell to the second state according to one embodiment as described in additional detail below. The different signals may be generated and/or controlled using different circuitry in one embodiment.

Figure 1A:
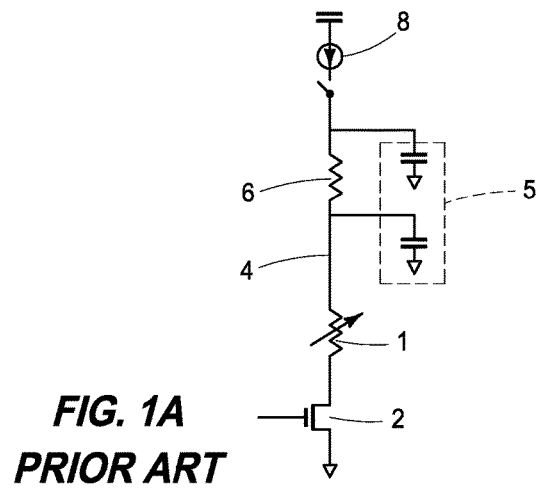
FIG. 1A is a conventional memory cell and associated circuitry.
Figure 1B:
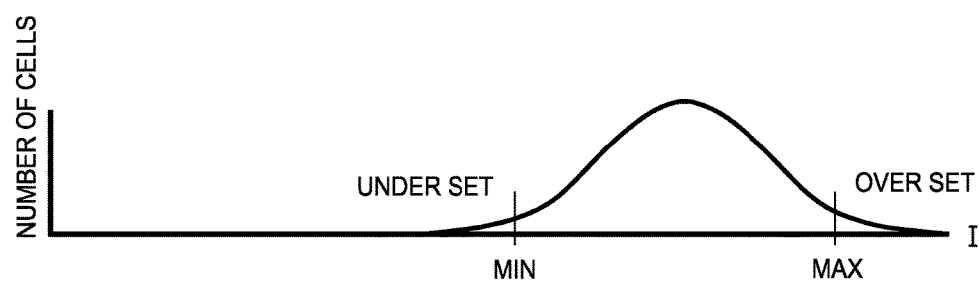
FIG. 1B is a graphical representation of a current distribution resulting from variations in selector transistors.
Figure 1C:
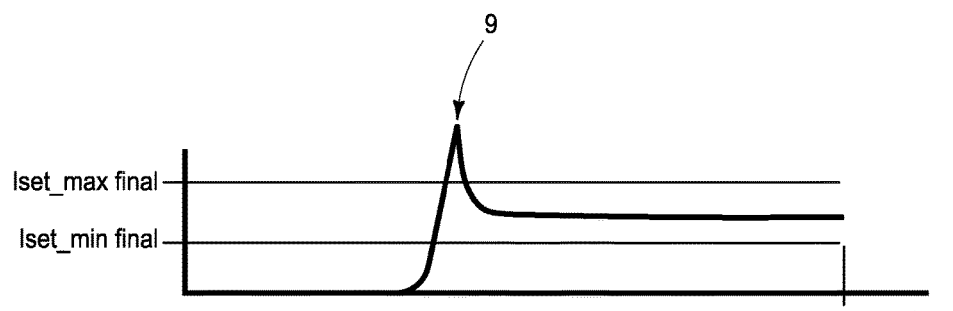
FIG. 1C is a graphical representation of current of a conventional programming signal when the current source of FIG. 1A is utilized.
Figure 2:
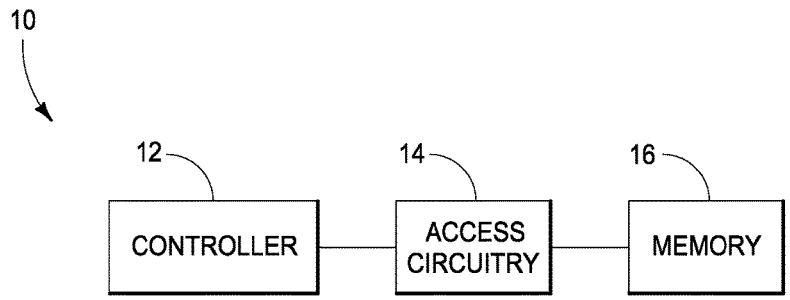
FIG. 2 is a functional block diagram of a memory system according to one embodiment.

Referring to FIG. 2, a functional block diagram of a memory system 10 is shown according to one embodiment. The illustrated memory system 10 includes a controller 12, access circuitry 14, and memory 16. Memory system 10 may be implemented within or with respect to various associated devices (not shown), such as computers, cameras, media players, and thumb drives, in some examples. Memory system 10 stores data generated or utilized by the associated devices in the described examples. Other embodiments of memory system 10 are possible and may include more, less and/or alternative components or circuitry.

Controller 12 controls operations of writing, reading and re-writing data of memory 16 as well as interfacing with other components or circuitry, such as sources of data to be stored within memory 16. Controller 12 may access and process commands with respect to memory 16 during operations of an associated device. Example commands instruct the generation of reset and set voltage signals which are applied to memory 16 in one embodiment. The signals are used to write data to memory (i.e., program the memory) and are both referred to as write operations in one embodiment. Controller 12 may also control the application of read and verify pulses to memory 16 to read and verify stored data in one embodiment.

In one embodiment, controller 12 is configured to process data, control data access and storage, issue commands, and control other desired operations. Controller 12 may comprise processing circuitry configured to execute programming provided by appropriate computer-readable storage media (e.g., memory) in at least one embodiment. For example, the controller 12 may be implemented as one or more microcontroller, processor(s) and/or other structure configured to execute executable instructions including, for example, software and/or firmware instructions. Other example embodiments of controller 12 may include hardware logic, PGA, FPGA, ASIC, state machines, and/or other structures alone or in combination with one or more processor(s). These examples of controller 12 are for illustration and other configurations are possible.

Access circuitry 14 is coupled with controller 12 and memory 16 and is configured to implement addressing (selection of columns and rows of memory 16), writing, reading, verifying and re-writing operations with respect to memory cells of memory 16 in one embodiment. For example, access circuitry 14 may receive instructions from controller 12 to select a specific block, page, word or byte of the memory 16 as well as to implement writing, reading, verifying and re-writing with respect to a plurality of cells of the selected block, page, word or byte. As discussed below, the access circuitry 14 may apply electrical voltage potentials to the memory 16 to perform write, read and verification operations in one embodiment. Access circuitry 14 may also include a plurality of individual access circuits such as selector transistors coupled with the memory cells as described further below.

Memory 16 includes a plurality of memory cells configured to store data, conductors electrically connected with the memory cells, and perhaps additional circuitry, for example circuits of the access circuitry 14. At least some of the memory cells are individually capable of being programmed to a plurality of different memory states at a plurality of moments in time. Memory 16 is accessible to the user and/or associated device for storage of digital information. The memory cells may be configured as non-volatile cells in some implementations and may have different electrical resistances corresponding to different memory states. In one specific example implementation, memory 16 is implemented as conductive-bridge random access memory (CBRAM) and the memory cells are conductive-bridge memory cells.

Memory 16 may be implemented in different arrangements in different embodiments. For example, the memory 16 may be implemented within a memory device, such as a chip, a portion of the chip (e.g., tiles and/or sub-tiles discussed below) or other arrangements. The memory device may also include controller 12 and/or access circuitry 14 or portions thereof.

Figure 3:
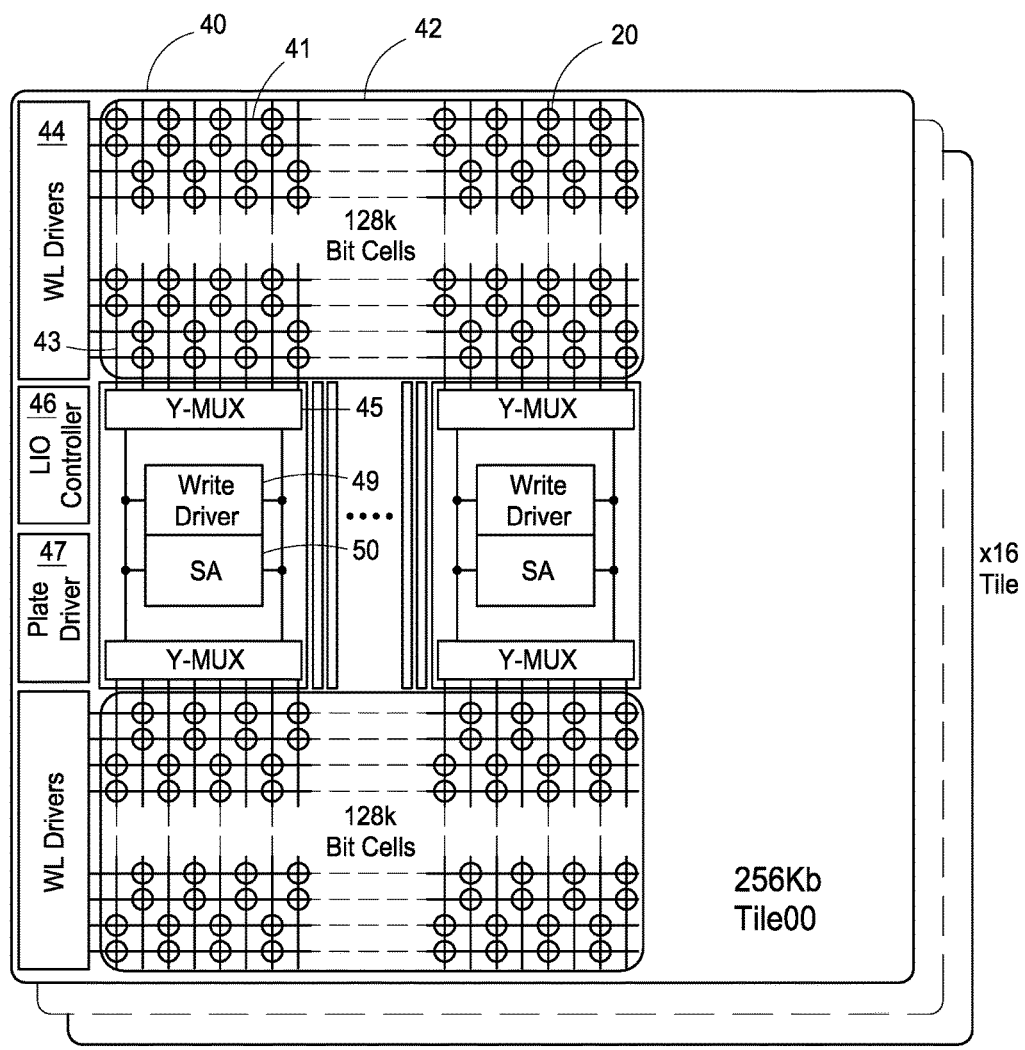
FIG. 3 is an illustrative representation of a tile of a memory chip according to one embodiment.

Referring to FIG. 3, a tile 40 of a memory device is shown according to one embodiment. The memory device may comprise a memory chip in one embodiment and which may include a plurality of tiles 40 (e.g., 16 tiles in the illustrated example).

The depicted tile 40 includes a memory array 42 of a plurality of memory cells 20 which may be individually addressed by WL drivers 44 and Y-MUX circuitry 45. WL drivers 44 are coupled with a plurality of word lines 41 and Y-MUX circuitry 45 is coupled with a plurality of bit lines 43.

The tile 40 additionally includes an LIO controller 46, plate driver 47, write driver 49 and a sense amplifier 50 in the illustrated embodiment. Tile 40 includes sixty-four of individual circuits 48, 49 and 50 to interface with memory cells 20 of array 42 in parallel in one embodiment. LIO controller 46 provides interfacing of the sense amplifiers 50 of a given bank of the tile 40 to a databus (not shown) which is shared between multiple banks and also interfaces with an I/O block of the memory chip. Plate driver 47 drives the plate voltage to the various voltage values utilized for reading and writing. The write driver 49 drives the bit line voltage to the various voltage values utilized for writing. Sense amplifiers 50 sense the memory states of memory cells 20 during read and verification operations.

Figure 4A:
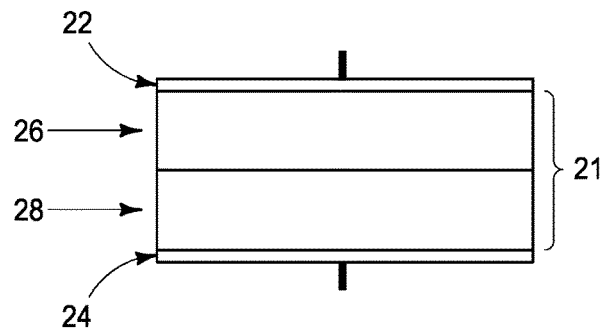
FIGS. 4A-4C are illustrative representations of a memory element of a memory cell according to one embodiment.
Figure 4B:
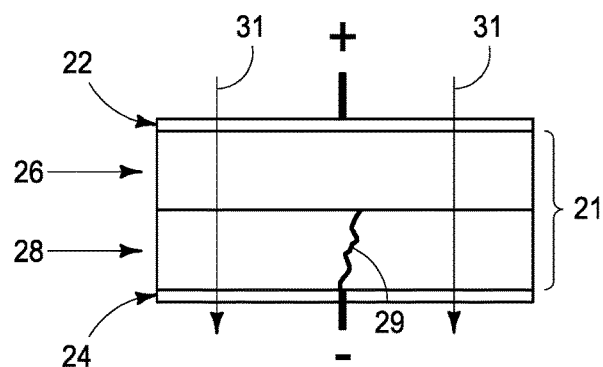
Figure 4C:
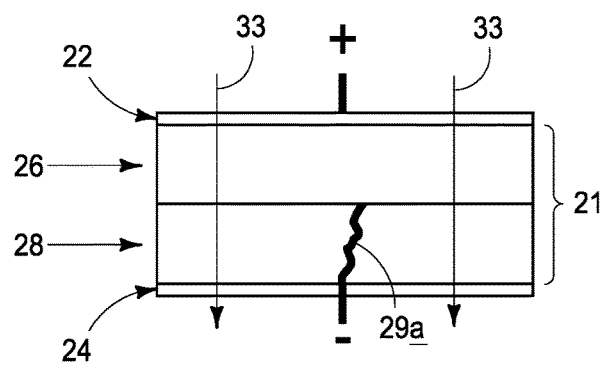

Referring to FIGS. 4A-4C, a method of programming a memory element 21 of a memory cell is shown according to one embodiment. Memory element 21 is configured to have different electrical resistances corresponding to different memory states of the memory cell in the described example embodiment.

Memory element 21 includes an electrically conductive ion reservoir layer 26 and a layer 28 of insulative or dielectric material between a plurality of opposing electrically conductive electrodes 22, 24 in one embodiment. In a more specific embodiment, reservoir layer 26 is a Cu+ source layer (e.g., CuTe), example materials of the dielectric layer 28 include AlOx, HfOx, and ZrOx, and electrode 24 is titanium nitride (TiN). Other embodiments are possible.

FIG. 4A illustrates the memory element 21 in a high resistance state which corresponds to a reset state of the memory cell.

The memory element 21 may thereafter be programmed to a low resistance state which corresponds to a set state of the memory cell. As mentioned previously, an initial signal is applied to the memory element 21 as discussed with respect to FIG. 4B below to initially form an electrically conductive structure to initially program the memory cell from the first state into the second state. Thereafter, a second different signal is applied to the memory element 21 as discussed with respect to FIG. 4C below to provide the electrically conductive structure in the well-set state to complete the programming of the memory cell to the second state according to one embodiment. The application of the first and second signals may be referred to as a single programming operation of the memory cell from the reset state to the set state in one embodiment.

In FIG. 4B, a first programming signal 31 is applied to the memory element which results in the formation of an electrically conductive structure 29 (e.g., filament or cation) comprising Cu ions which lowers the electrical resistance of the memory element 21. More specifically, the initial signal provides a voltage potential/bias to electrode 22 which is more positive than the voltage potential/bias applied to electrode 24. The application of this signal causes inducement of Cu ions into dielectric layer 28 and formation of the electrically conductive structure 29 through dielectric layer 28 and between conductive source layer 26 and electrode 24. The formation of the structure 29 provides the memory element 21 in the low resistance state. In one embodiment, the structure 29 comprises material (e.g., copper) from the source layer 26.

The signal 31 is ceased following the formation of the electrically conductive structure 29 and the provision of the memory element 21 in the low resistance state. However, the memory element 21 is only initially programmed in FIG. 4B and may be unable to retain its programmed low resistance state following the initial programming of the memory element 21.

In FIG. 4C, a second programming signal 33 is applied to the memory element 21 which provides the previously-formed structure 29 and memory cell in the well-set state and completes the programming of the memory cell from the reset state to the set state which is also well-set where the set state of the memory cell is retained following ceasing of the programming signals and which set state may be subsequently read. In one embodiment, the second programming signal 33 increases the number of ions (e.g., Copper ions) in the electrically conductive structure 29 compared with the structure before the application of the second programming signal. The application of the second programming signal 33 to the memory element 21 may be considered to increase the width of the electrically conductive structure 29 in one embodiment. As discussed in detail in one embodiment below, different circuits of memory system 10 are used to generate and/or control the first and second signals which are provided to the memory element 21.

The memory cell may thereafter be programmed to a high resistance state where the conductive structures 29 are removed and not present. In one embodiment, the memory element 21 of the memory cell may be programmed to the high resistance state by the application of a voltage potential/bias to electrode 24 which is more positive than the voltage potential/bias applied to electrode 22. The application of these signals causes Cu ions to return into source layer 26 and dissolves any electrically conductive structures 29 within dielectric layer 28, thereby increasing the electrical resistance of the memory element 21 between the electrodes 22, 24 and providing the memory cell in the high resistance state.

The memory cell may be repeatedly written between the high and low resistance states at different moments in time to store different data values corresponding to the different memory (e.g., resistive) states. In one embodiment, a current is passed through the memory cell and the sense circuitry may measure the current to determine the resistance and memory state of the memory cell.

Referring to FIGS. 5A-5D, additional details regarding programming of memory cell 20 from the high resistance state to the low resistance state are discussed according to one example embodiment.

The illustrated example memory cell 20 is a one transistor/one resistor (1T1R) CBRAM memory cell. In particular, memory element 21 is coupled with an access circuit embodied as a selector transistor 23 which is controlled via a respective word line 41 in the illustrated embodiment. Other configurations of memory cell 20 may be programmed in other embodiments including other resistive memory cell arrangements which have different electrical resistances corresponding to different memory states.

A bit line 43 may be selectively coupled with a voltage source 58 via switch 51 and bit line 43 has associated bit line capacitance 52 and bit line resistance 54. Word line 41 is used to select the memory cell 20 for reading/writing/verification and bit line 43 is used to conduct appropriate signals for the reading/writing/verification of the memory cell 20.

As mentioned previously, a plurality of different programming signals 31, 33 are utilized to program memory cell 20 from the high to low resistance states in one embodiment.

Figure 5A:
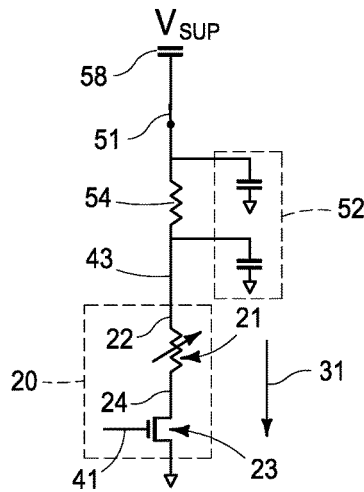
FIGS. 5A-5C are circuit schematics of programming a memory cell using different programming signals according to one embodiment.

As shown in FIG. 5A, the application of first signal 31 is used to form an electrically conductive structure within the memory element 21 of memory cell 20. Initially, bit line 43 is coupled with source 58 and is nearly at the supply voltage Vsup with substantially all of the voltage drop being across the memory cell 20 (i.e., the voltage at electrode 22 is Vsup−I*Rbl where Rbl is the bit line resistance 54). The current of the first signal 31 is regulated by the gate of selector transistor 23 to be greater than Iset_min_initial and less than Iset_max_initial. In particular, the gate of selector transistor 23 is held sufficiently low to not over-set any memory cells and to guarantee the formation of at least minimal electrically conductive structures within the memory cells coupled with the common word line. The selector transistor 23 may be referred to as regulation circuitry of the first programming signal in some embodiments.

Following the formation of an electrically conductive structure (see FIG. 4B), the voltage of the drain of the selector transistor 23 which is coupled with the memory element 21 immediately rises (i.e., the voltage at electrode 24 is Vsup−I*Rbl−I*Rcell where Rcell is the resistance of the memory cell 20) and the current of the selector transistor 23 saturates and transistor 23 responds nearly instantly to the newly-formed electrically conductive structure 29 in the memory cell 20 and limits currents from bit line capacitance to avoid destructive transient current spikes resulting from the transition of the memory element 21 from the high electrical resistance to the low electrical resistance.

Although present to provide the memory cell 20 in a low resistance state, the electrically conductive structure may be "weakly set" during the initial programming of the memory element 21 and the low resistance state of the memory element 21 may not be retained following the application of the first signal 31.

Accordingly, as discussed in detail below, the second signal 33 is applied to the memory element 21 to complete the set programming and provide the memory element 21 in a well-set low resistance final state wherein the electrically conductive structure is configured to retain the programming of the memory cell 20 in the low resistance state. In example embodiments, the second signal 33 may be applied after the application of the first signal 31 for a predetermined amount of time which is sufficient to initially form the structure 29 or after detection of increased current flow through memory element 21 resulting from the formation of the initial structure 29.

Figure 5C:
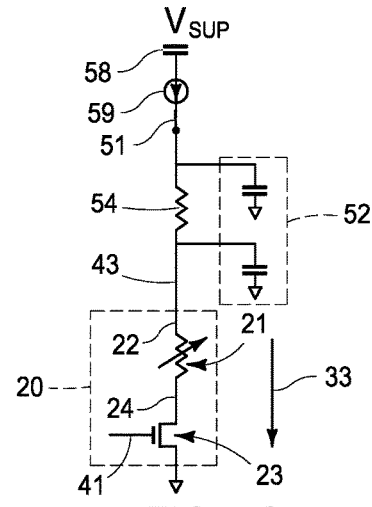
Figure 5B:
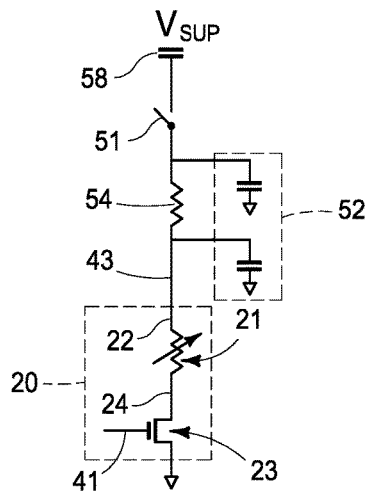

As shown in FIG. 5B, the switch 51 is opened following application of the first signal 31 and to disconnect the voltage source 58 from the bit line 43 and the bit line 43 discharges through the memory cell 20. The bit line 43 is sufficiently discharged to avoid a transient current above Iset_max_final when the gate of the selector transistor 43 is raised. The bit line 43 is discharged to change the voltage at electrode 22 from Vsup−I*Rbl to less than I*(Rselector+ Rcell) where Rselector is the resistance of selector transistor 23.

Following appropriate discharge of bit line 43, a second signal 33 shown in FIG. 5C is driven through bit line 43 to complete the programming of the memory cell 20 wherein retention of the memory cell 20 in the low resistance state is provided following the programming. In one embodiment, the second signal 33 is regulated to have a constant current which is greater than the regulated current of the first signal 31 to provide the memory cell 20 in the well-set state where the memory cell 20 remains in the low resistance state for data storage and subsequent data access. The current of the second signal 33 may be greater than the first signal 31 since the actual applied current distribution of the second signal 33 is tighter than the first signal 31 in the described embodiment. In one embodiment, the current of the second signal 33 is greater than Iset_min_final and less than Iset_max_final.

As shown in FIG. 5C, the switch 52 is closed following suitable discharge of the bit line 43 which reconnects supply 58 which is additionally connected with a current source 59 (which may be implemented outside of the array 42 and within writer driver 49 of FIG. 3 in one embodiment). The gate of the selector transistor 23 is raised simultaneously with the closing of the switch 52 to overdrive the selector transistor 23 providing linear operation. The gate of selector transistor 23 may be raised to Vsup if current is not limited. The selector transistor 23 may also be referred to as an access circuit in some embodiments.

The current source 59 generates and regulates the second signal 33 which is applied via the bit line 43 to the memory cell 20 and completes the programming of the memory cell 20 to the well-set low resistance state. A current spike due to bit line capacitance 52 is avoided since a relatively weakly set electrically conductive structure is present in the memory cell 20 following the application of the first signal. Current source 59 may be referred to as regulation circuitry of the second programming signal in one embodiment.

Figure 6:
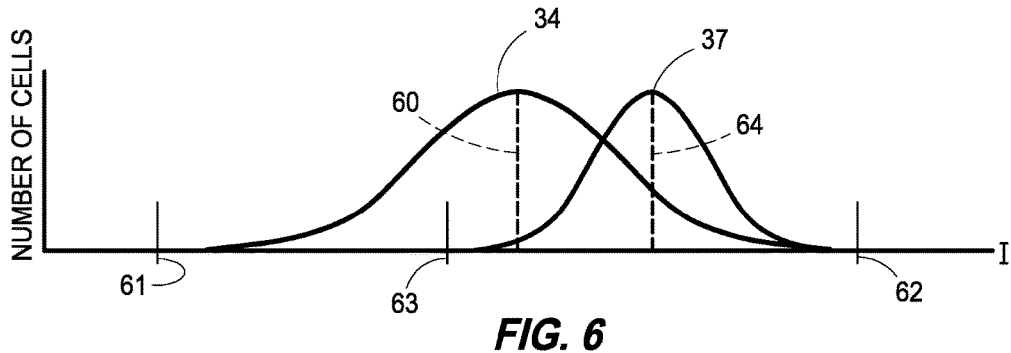
FIG. 6 are current distributions of different programming signals according to one embodiment.

Referring to FIG. 6, distributions of currents of the first and second programming signals applied to numerous memory cells of a memory array are shown by lines 35, 37, respectively. Current 60 represents a target of the first signal 31 (i.e., Iset_target_initial) which should be trimmed such that the applied cell current distribution is greater than the current 61 which corresponds to Iset_min_initial. Iset_min_initial is the minimum current used to form a weakly-set electrically conductive structure within a population of memory cells. The relatively wide distribution of first signal 31 results from the utilization of gate regulation of the selector transistor in one embodiment.

Current 64 represents a target of the second signal 33 (i.e., Iset_target_final) which should be trimmed such that the applied cell current distribution is between currents 63 and 62 which correspond to Iset_min_final and Iset_max_final, respectively. Iset_min_final is the minimum current of second signal 31 to form well-set electrically conductive structures for desired data retention goals in the population of memory cells. Iset_max_final is the maximum current allowed by the population of memory cells and may be determined by overset of the memory cells or other reliability mechanism defined by the applicable technology. The tighter distribution 37 of the second signal 33 results from regulation of the current using a current source 59 in one embodiment. The lines 34, 37 illustrate the different ranges of current of the respective first and second signals 31, 33 which are applied to the population of memory cells in one embodiment.

Figure 7:
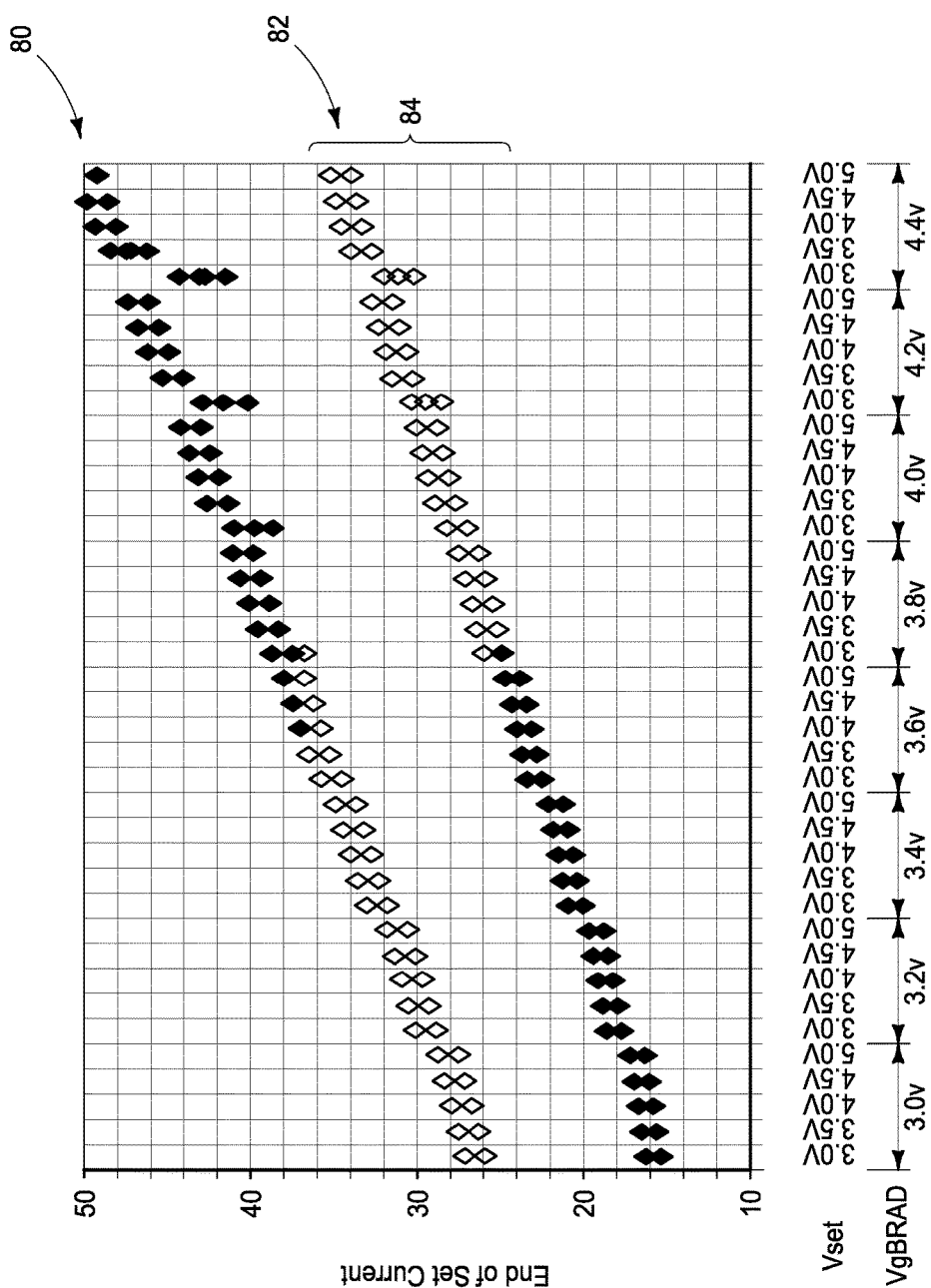
FIG. 7 is a graphical representation of end of set currents for a conventional memory cell.

Referring to FIG. 7, a simulation is shown for use of a conventional set programming signal using regulation of the gate of the selector transistor for one CBRAM technology. The two main groups of curves 80, 82 represent variation extremes of current during saturation of the selector transistor (i.e., $I_{DSAT}$) and zone 84 represents acceptable end-of-set current. FIG. 7 illustrates there is no working window in the conventional regulation due to wide variation of the selector transistors as actual cell current is below minimum for weaker selector transistors with use of lower selector transistor gate voltages (i.e., VgBRAD) while actual cell current is above maximum for stronger selector transistors with use of higher selector transistor gate voltages. Vset represents the full supply voltage.

Figure 8:
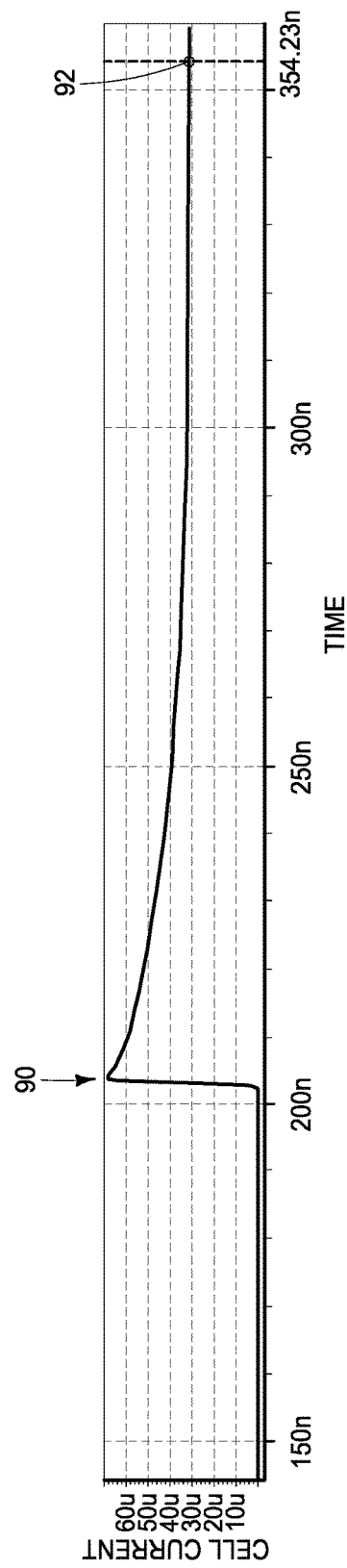
FIG. 8 is a graphical representation of cell current for a conventional memory cell.

Referring to FIG. 8, a simulation is shown for use of a conventional set programming signal using a current source. A transient 90 is formed in the cell current due to discharge of the bit line capacitance through the memory cell after the initial filament is formed and which may be above a desired maximum current. In particular, the transient 90 is approximately 70 uA which is above the desired maximum current of 37 uA for a desired final current 92 of approximately 31 uA in one illustrative example technology.

Figure 9:
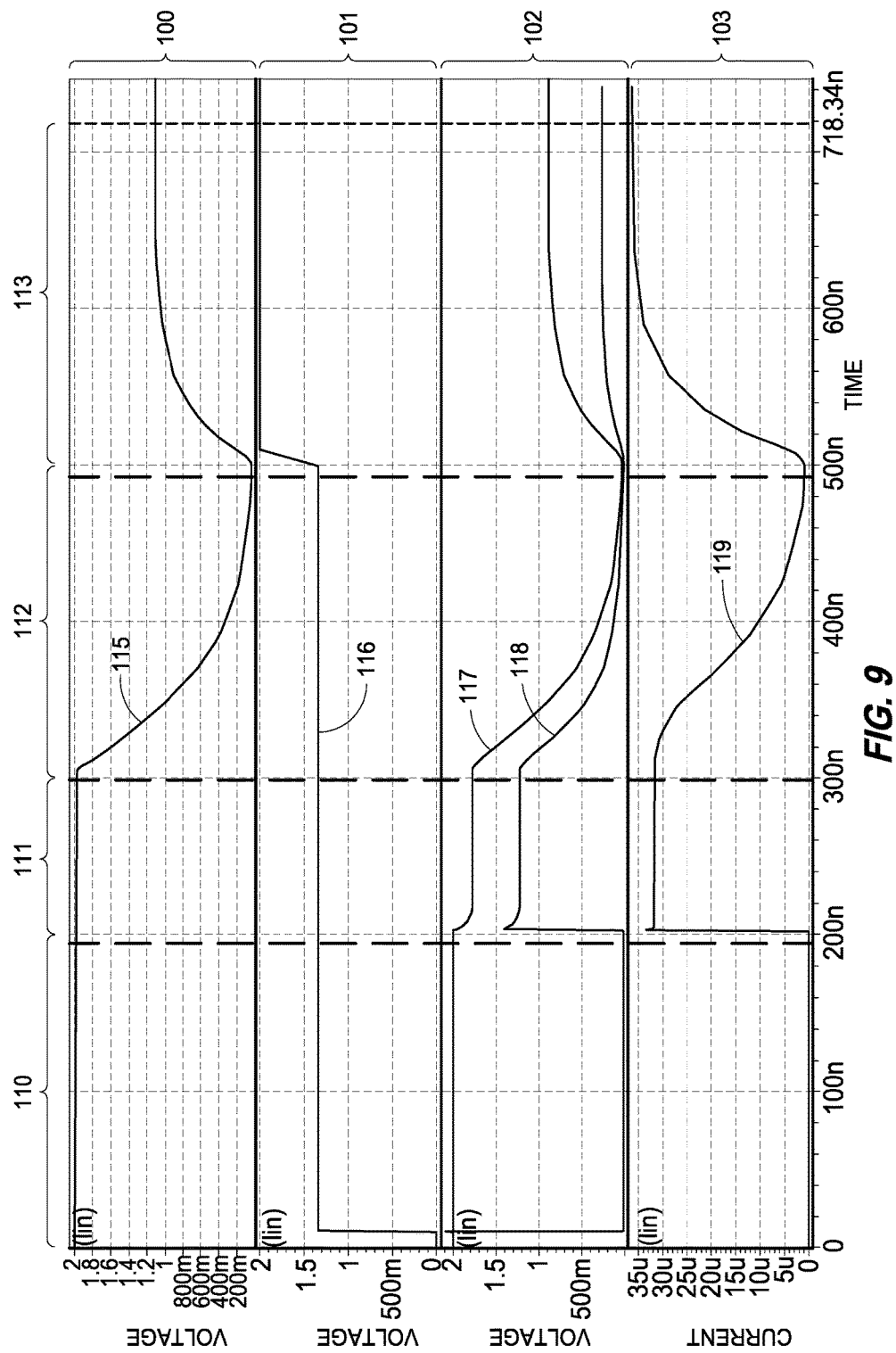
FIG. 9 is a plurality of graphical representations of programming of a memory cell according to one embodiment.

Referring to FIG. 9, a simulation is shown using different first and second signals to implement a set programming operation according to an embodiment. FIG. 9 shows a plurality of portions of the graph including a first portion 110 corresponding to application of the first signal to the memory cell, a second portion 111 corresponding to initial formation of an electrically conductive structure within the memory cell where the voltage of the drain of the selector transistor rises and the selector current saturates, portion 112 corresponding to discharging of the bit line, and portion 113 corresponding to application of the second signal to the memory cell.

Line 115 of graph 100 represents the voltage of the first signal applied to the memory cell. As shown, substantially the full supply voltage is provided to the memory cell during portions 110, 111 and the bit line discharges during portion 112 and the voltage of the bit line is regulated during portion 113.

Line 116 of graph 101 represents the voltage of the gate of the selector transistor. The gate voltage is regulated during portions 110-112 and is at full supply voltage at portion 113.

Lines 117, 118 of graph 102 represent voltages at electrodes 22, 24 adjacent to the memory element 21 of FIG. 4A with the selector transistor being in a saturated state in portion 111 and in a linear state in portion 113.

Line 119 for graph 103 represents current through the memory cell with relatively wide variation in portion 111 and relatively small variation in portion 113.

Figure 10:
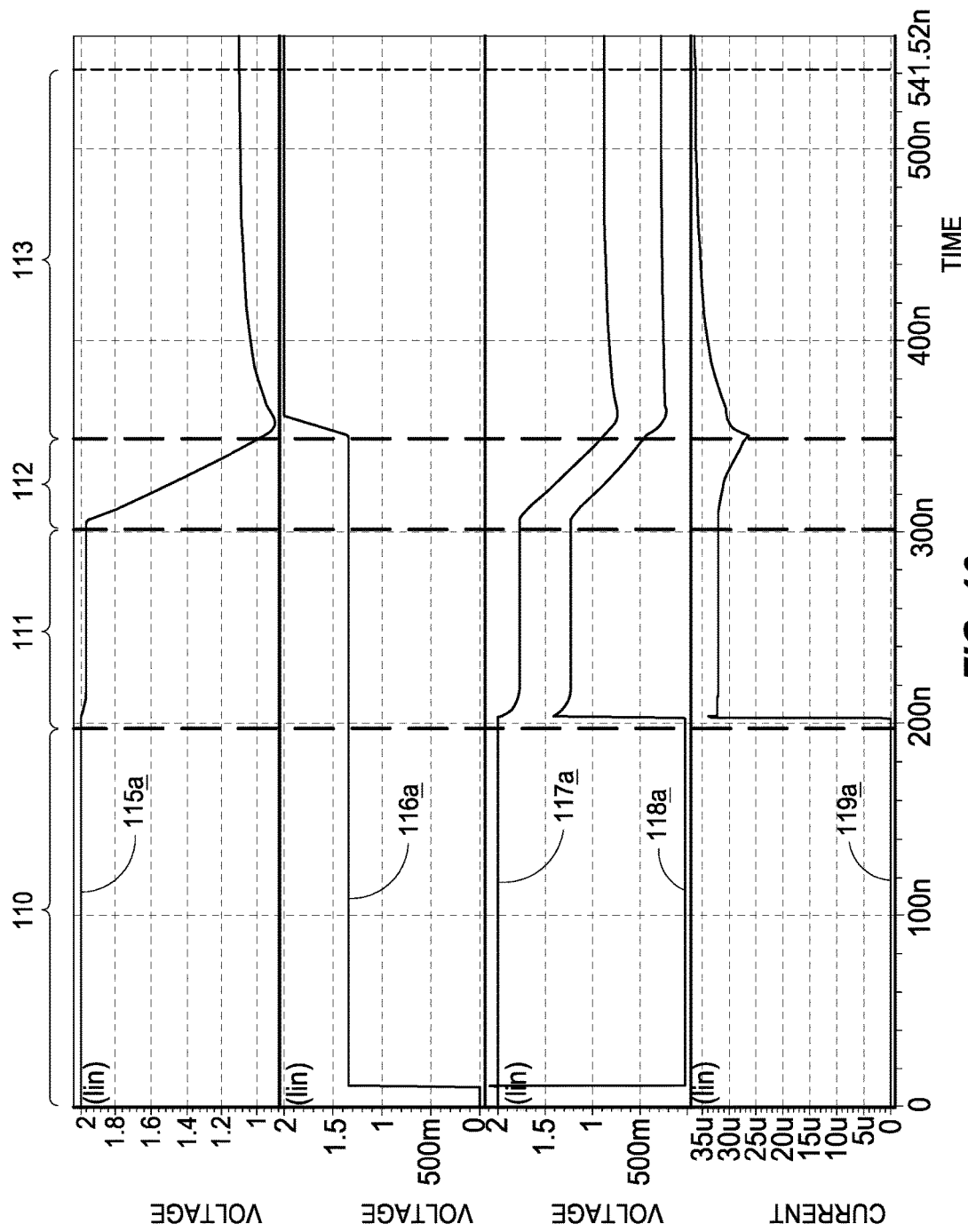
FIG. 10 is a plurality of graphical representations of programming of a memory cell according to one embodiment.

As shown in the example of FIG. 9, the bit line is fully discharged in portion 112. However, in some embodiments, the discharging may be truncated and the bit line is not fully discharged. More specifically, the bit line is discharged sufficiently to a level above full discharge, such as shown in FIG. 10, to avoid high transient currents before raising the gate voltage of the selector transistor in portion 113. Similar to FIG. 9, Line 115a represents the voltage of the first signal applied to the memory cell, line 116a represents the voltage of the gate of the selector transistor, lines 117a, 118a represent voltages at electrodes 22, 24, and line 119a represents current through the memory cell. In addition, a discharge device may be coupled with the bit line to discharge the bit line in some embodiments and which may provide increased discharging speeds.

The different first and second programming signals may be referred to as different programming pulses or parts or segments of a multi-step programming pulse sequence in some embodiments, and for example, represented by line 115 during graph portions 110-113 in one embodiment. The sequence of first regulating the bit line using the gate of the selector transistor and second regulating the bit line with the use of a current source in one embodiment provides a tighter end-of-pulse actual applied current distribution without the accompanying current spike associated with a current-source load of conventional arrangements. As discussed above in an example embodiment, different regulation circuitry is configured to generate and/or control the different first and second signals which are used to program the memory cell 20 from the high to low resistance states. At least some embodiments use regulation of the selector transistor to provide the regulated first signal to the memory cell and a current source to provide the second signal having a constant current following discharging of the bit line.

CONCLUSION

In some embodiments, a memory system comprises a memory cell configured to have a plurality of different memory states, an access circuit coupled with the memory cell and configured to provide a first signal to a memory element of the memory cell to program the memory cell from a first memory state to a second memory state, and a current source coupled with the memory cell and configured to generate a second signal which is provided to the memory element of the memory cell after the first signal to complete programming of the memory cell from the first memory state to the second memory state.

In some embodiments, a memory system comprises a memory array comprising a plurality of memory cells and a plurality of access circuits coupled with respective ones of the memory cells, a plurality of bit lines coupled with respective ones of the access circuits, and wherein the access circuits are configured to provide a plurality of first signals to respective ones of the memory cells to change individual ones of the memory cells from a high electrical resistance corresponding to a first memory state of the individual memory cell to a low electrical resistance corresponding to a second memory state of the individual memory cell, and a plurality of current sources configured to provide a plurality of second signals via the bit lines to respective ones of the memory cells while the memory cells have the low electrical resistance and to configure the memory cells to retain the low electrical resistance after the programming of the memory cells to the second memory state.

In some embodiments, a memory programming method comprises applying a first signal to an access circuit, regulating the first signal using the access circuit, applying the regulated first signal to a memory cell, changing the memory cell from a first memory state to a second memory state during the applying, using a current source, generating a second signal, and after the changing, applying the second signal to the memory cell in the second memory state to complete the programming of the memory cell to the second memory state.

In some embodiments, a memory programming method comprises providing a first signal to a memory cell to program the memory cell from a first memory state to a second memory state, changing the memory cell from the first memory state to the second memory state during the provision of the first signal to the memory cell, ceasing the provision of the first signal to the memory cell after the changing, and after the ceasing, applying a second signal to the memory cell to complete programming of the memory cell to the second memory state.

In some embodiments, a memory programming method comprises first applying a first signal to a memory cell comprising a memory element which is configured to have different electrical resistances corresponding to different memory states of the memory cell, forming an electrically conductive structure having an initial state within the memory element of the memory cell during the first applying and which changes the electrical resistance of the memory element from a high electrical resistance corresponding to a first of the memory states to a low electrical resistance corresponding to a second of the memory states, and after the forming of the electrically conductive structure, second applying a second signal to the memory element to provide the electrically conductive structure in a final state.

In some embodiments, a memory programming method comprises applying first and second signals to a memory cell to change an electrical resistance of the memory cell from a high electrical resistance corresponding to a first memory state to a low electrical resistance corresponding to a second memory state, regulating the first signal using a selector transistor coupled with the memory cell, and regulating the second signal using a current source coupled with the memory cell.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

What is claimed is:

1. A memory system comprising:
   a memory element configured to have a plurality of different memory states at a plurality of different moments in time;
   first circuitry configured to control an application of a first programming signal to the memory element to change the memory element from a first to a second of the memory states, and wherein the first circuitry is configured to regulate a current of the first programming signal which is applied to the memory element to be within a determined range; and
   second circuitry configured to apply a second programming signal to the memory element after the memory element changes from the first to the second of the memory states, and wherein the second circuitry is configured to regulate the second programming signal which is applied to the memory element to have increased current compared with the first programming signal, and wherein the application of the second programming signal to the memory element completes programming of the memory element from the first to the second of the memory states.

2. The system of claim 1 wherein the first circuitry comprises a selector transistor configured to regulate the first programming signal and the second circuitry comprises a current source configured to generate and regulate the second programming signal.

3. The system of claim 2 wherein the first circuitry comprises a voltage source configured to provide a supply voltage to generate the first programming signal.

4. The system of claim 2 wherein the selector transistor is configured to be overdriven during the application of the second programming signal to the memory element.

5. The system of claim 2 wherein the selector transistor is configured to saturate following the change of the memory element from the first to the second memory states.

6. The system of claim 1 wherein the second programming signal has at least a substantially constant current during the application of the second programming signal to the memory element.

7. The system of claim 1 wherein the memory element has different electrical resistances corresponding to the different memory states.

8. The system of claim 7 wherein an electrically conductive structure is formed through dielectric material of the memory element as a result of the application of the first programming signal to the memory element, and the memory element has a decreased electrical resistance in the second memory state compared with an electrical resistance of the memory element in the first memory state.

9. The system of claim 8 wherein the first circuitry is configured to limit current conducted through the memory element following the formation of the electrically conductive structure.

10. The system of claim 8 wherein the application of the second programming signal to the memory element increases a number of conductive ions within the electrically conductive structure.

11. The system of claim 1 wherein the second circuitry is configured to generate the second programming signal having a tighter current distribution compared with a current distribution of the first programming signal.

12. The system of claim 1 wherein the memory element is unable to retain the second memory state after the application of the first programming signal to the memory element, and the memory element is configured to retain the second memory state after the application of the second programming signal to the memory element.

13. The system of claim 1 wherein the first circuitry is configured to apply the first programming signal to the memory element for a determined amount of time.

14. The system of claim 1 wherein the first circuitry is configured to apply the first programming signal to the memory element until a flow of increased current through the memory element is detected during the application of the first programming signal to the memory element, and the application of the first programming signal to the memory element is ceased as a result of the detection.

15. A memory system comprising:
a memory element which is configured to have a plurality of different memory states at different moments in time; and circuitry configured to apply a first programming signal to the memory element to change the memory element from a first of the memory states to a second of the memory states, and after the application of the first programming signal, to apply a second programming signal to the memory element to complete programming of the memory element to the second memory state; and wherein the memory element is unable to retain the second memory state after the application of the first programming signal to the memory element, and the memory element is configured to retain the second memory state after the application of the second programming signal to the memory element.

16. The system of claim 15 wherein the second programming signal has increased current compared with the first programming signal.

17. The system of claim 16 wherein the second programming signal has a tighter current distribution compared with a current distribution of the first programming signal.

18. The system of claim 15 wherein the circuitry utilizes a voltage source to generate the first programming signal and a current source to generate the second programming signal.

19. The system of claim 15 wherein the circuitry comprises a selector transistor configured to regulate a current of the first programming signal and a current source configured to regulate a current of the second programming signal.

20. The system of claim 15 wherein the circuitry is configured to apply the second programming signal which has at least a substantially constant current to the memory element.

21. The system of claim 15 wherein the memory element has different electrical resistances corresponding to the different memory states.

22. The system of claim 21 wherein an electrically conductive structure is formed through dielectric material of the memory element as a result of the application of the first programming signal to the memory element, and the memory element has a decreased electrical resistance in the second memory state compared with the first memory state.

23. The system of claim 22 wherein the circuitry is configured to limit conduction of current through the memory element following the formation of the electrically conductive structure.

24. A memory system comprising:
a memory element configured to have a plurality of different memory states at different moments in time;
a bitline coupled with the memory element;
a voltage source;
a current source; and
wherein the voltage source is coupled with the bitline at a first of the moments in time to provide a voltage potential to the memory element to change the memory element from a first of the memory states to a second of the memory states, and wherein the current source is coupled with the bitline at a second of the moments in time after the first moment in time to provide a current to the memory element to complete programming of the memory element from the first memory state to the second memory state.

25. The system of claim 24 further comprising a selector transistor coupled with the memory element and configured to regulate a current through the memory element during the provision of the voltage potential to the memory element.

26. The system of claim 25 wherein the selector transistor is configured to saturate following the change of the memory element from the first to the second memory states.

27. The system of claim 25 wherein the selector transistor is configured to limit current through the memory element following the change of the memory element from the first to the second memory states.

28. The system of claim 24 wherein the current source is configured to regulate the current which is provided to the memory element to be at least substantially constant.

29. The system of claim 24 wherein an electrically conductive structure is formed through dielectric material of the memory element as a result of the provision of the voltage potential to the memory element, and the memory element has a decreased electrical resistance in the second memory state compared with the first memory state.

30. The system of claim 24 wherein the memory element is unable to retain the second memory state after the provision of the voltage potential to the memory element, and the memory element is configured to retain the second memory state after the application of the current to the memory element.

31. A memory programming method comprising:
using a first bias signal, biasing an access circuit which controls provision of a first programming signal to a memory element to form an electrically conductive structure within dielectric material of the memory element and which changes an electrical resistance of the memory element from a high resistance state to a low resistance state;
after the formation of the electrically conductive structure, applying a second programming signal to the memory element to complete programming of the memory element to the low resistance state; and
using a second bias signal, biasing the access circuit during the applying the second programming signal to the memory element, and wherein the second bias signal has an increased voltage potential compared with the first bias signal.

32. The method of claim 31 wherein the biasing the access circuit using the first bias signal regulates current of the first programming signal to be within a desired range.

33. The method of claim 31 further comprising generating the second programming signal using a current source.

34. The method of claim 31 further comprising regulating the second programming signal to have at least a substantially constant current.

35. The method of claim 31 wherein the second programming signal has increased current compared with the first programming signal.

36. The method of claim 31 further comprising, using the access circuit, limiting current conducted through the memory element after the formation of the electrically conductive structure.

37. The method of claim 31 wherein the access circuit comprises a selector transistor and the second bias signal overdrives the selector transistor during the applying the second programming signal to the memory element.

38. The method of claim 31 wherein the applying the second programming signal increases a number of conductive ions within the electrically conductive structure.

39. The method of claim 31 further comprising regulating current of the first and second programming signals using different circuitry.

40. The method of claim 31 wherein the memory element is unable to retain the second memory state after the provision of the first programming signal and the memory element is able to retain the second memory state after the application of the second programming signal.

41. The method of claim 31 wherein the second programming signal has a tighter current distribution compared with the first programming signal.

42. The method of claim 31 wherein the biasing the access circuit using the first bias signal comprises biasing for a determined amount of time.

43. The method of claim 31 further comprising detecting the change of the electrical resistance of the memory element during the biasing of the access circuit using the first bias signal, and initiating the biasing of the access circuit using the second bias signal as a result of the detecting.

* * * * *

UNITED STATES PATENT AND TRADEMARK OFFICE
CERTIFICATE OF CORRECTION

PATENT NO. : 9,837,151 B2
APPLICATION NO. : 15/150168
DATED : December 5, 2017
INVENTOR(S) : Richard E. Fackenthal and Simone Lombardo It is certified that error appears in the above-identified patent and that said Letters Patent is hereby corrected as shown below:

In the Specification

Column 7, Line 33 – Replace "switch 52 is" with --switch 51 is--

Column 7, Line 39 – Replace "switch 52 to" with --switch 51 to--

Column 7, Line 54 – Replace "signals applied to" with --signals 31, 33 applied to--

Column 7, Line 55 – Replace "lines 35, 37," with --lines 34, 37,--

Signed and Sealed this
Eighteenth Day of July, 2023

Katherine Kelly Vidal
*Director of the United States Patent and Trademark Office*